US008909183B2

(12) United States Patent
Morita (10) Patent No.: US 8,909,183 B2
(45) Date of Patent: Dec. 9, 2014

(54) AUTOMATIC GAIN CONTROL DEVICE (75) Inventor: Tadashi Morita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 11 days.

(21) Appl. No.: 13/814,795

(22) PCT Filed: Jan. 31, 2012

(86) PCT No.: PCT/JP2012/000644
§ 371 (c)(1),
(2), (4) Date: Feb. 7, 2013

(87) PCT Pub. No.: WO2012/114656
PCT Pub. Date: Aug. 30, 2012

(65) Prior Publication Data
US 2013/0127529 A1 May 23, 2013

(30) Foreign Application Priority Data
Feb. 24, 2011 (JP) .................. 2011-039019

(51) Int. Cl.
H04B 1/16 (2006.01)
H03G 3/20 (2006.01)
H03F 3/68 (2006.01)
H03G 3/30 (2006.01)
H04B 1/30 (2006.01)

(52) U.S. Cl.
CPC .. *H03G 3/20* (2013.01); *H03F 3/68* (2013.01); *H03G 3/3052* (2013.01); *H04B 1/30* (2013.01)
USPC ...................................... 455/234.2; 330/278

(58) Field of Classification Search
CPC ............... H04B 1/16; H03G 3/20; H03F 3/68
USPC .......... 455/323.1, 234.1, 234.2, 245.2, 247.1, 455/251.1; 330/124 R, 278
See application file for complete search history.

(56) References Cited

U.S. PATENT DOCUMENTS

| 5,917,865 A | * | 6/1999 | Kopmeiners et al. | ......... 375/345 |
| 6,259,391 B1 | * | 7/2001 | Pakravan et al. | ............. 341/139 |
| 6,993,291 B2 | * | 1/2006 | Parssinen et al. | .......... 455/67.11 |
| 7,302,245 B2 | * | 11/2007 | Yang et al. | ................. 455/232.1 |
| 7,676,208 B2 | * | 3/2010 | Lee et al. | ................... 455/234.1 |
| 2010/0034327 A1 | | 2/2010 | Rimini | |

FOREIGN PATENT DOCUMENTS

| JP | 2002-247121 A | 8/2002 |
| JP | 2003-110385 A | 4/2003 |
| JP | 2009-065312 A | 3/2009 |
| WO | 2010017147 A1 | 2/2010 |

OTHER PUBLICATIONS

International Search Report, mailed Mar. 19, 2012, for International Application No. PCT/JP2012/000644, 2 pages.

* cited by examiner

*Primary Examiner* — Blane J Jackson
(74) *Attorney, Agent, or Firm* — Seed IP Law Group PLLC (57) ABSTRACT A first frequency converter generates an I-system baseband signal based on a high-frequency received signal and a first local signal with a predetermined frequency band. A second frequency converter generates a Q-system baseband signal based on a high-frequency received signal and a second local signal 90° out of phase with the first local signal. First and second AD converters convert respective amplified I-system and Q-system baseband signals to digital data. First and second over-range detecters detect the over-range of the first and the second CAD converters. An automatic gain controller selects the gain based on the detection information of the over-range and the respective I-system and Q-system baseband signals. An offset setter gives a predetermined offset to the selected gain, and sets a gain after the offset with respect to the first or the second variable amplifier.

2 Claims, 7 Drawing Sheets

AUTOMATIC GAIN CONTROL DEVICE

TECHNICAL FIELD

The present invention relates to an automatic gain control device for adjusting signal power of a received signal to a predetermined range of signal power.

BACKGROUND ART

An automatic gain control device computes average power from an I signal component and a Q signal component of an input signal, and controls gain by which the input signal is multiplied according to the average power. The automatic gain control device adjusts signal power of the input signal to a predetermined range of signal power by controlling the gain. Processing of automatic gain control is used by many electronic devices, and is also called AGC (auto gain control) generally.

As the automatic gain control device using the conventional AGC, Patent Document 1 is known. The automatic gain control device shown in Patent Document 1 computes a received level of digital data of an AD converter output, and determines that an AD converter is in an overflow state when a computed value of the received level is more than or equal to a threshold value. When the overflow is detected, the automatic gain control device controls a gain variable amplifier based on a predefined predetermined value without using a received level ratio computed based on a received level average value.

PRIOR ART REFERENCE

Patent Document

Patent Document 1: JP-A-2002-247121

DISCLOSURE OF THE INVENTION

Problems that the Invention is to Solve

For example, in communication of millimeter waves in a frequency band of 60 GHz, use of the conventional automatic gain control device including Patent Document 1 described above has the following problem.

Concretely, in the millimeter-wave communication, a preamble period is very short, for example, about 1.2 μsec. For example, in the millimeter-wave communication for performing automatic gain control, automatic frequency adjustment and synchronous establishment for the preamble period, the automatic gain control requires the longest control time and is performed using about 600 nsec corresponding to about 50% of the preamble period.

However, the millimeter-wave communication does not often use an RSSI signal indicating received signal strength in a wireless LAN. Because of this, it is necessary for the millimeter-wave communication to control gain based on an I signal and a Q signal of a received signal in the automatic gain control. Consequently, it takes a long time to control the gain, and most of the preamble period may be spent on the automatic gain control, and automatic frequency adjustment and synchronous establishment become insufficient.

The invention has been implemented in view of the conventional circumstances described above, and an object of the invention is to provide an automatic gain control device for decreasing time necessary to perform automatic gain control in coarse adjustment of automatic gain control processing.

Means for Solving the Problems

The invention is the automatic gain control device described above, and includes a first frequency converter that generates an I-system baseband signal based on a high-frequency received signal and a first local signal with a predetermined frequency band, a second frequency converter that generates a Q-system baseband signal based on the high-frequency received signal and a second local signal 90° out of phase with the first local signal, a first variable amplifier that amplifies the generated I-system baseband signal, a second variable amplifier that amplifies the generated Q-system baseband signal, a first AD converter that converts the amplified I-system baseband signal into digital data, a second AD converter that converts the amplified Q-system baseband signal into digital data, a first over-range detector that detects an over-range of the first AD converter, a second over-range detector that detects an over-range of the second AD converter, an automatic gain controller that selects gains set in the first variable amplifier and the second variable amplifier based on detection information about the over-range, the I-system baseband signal or the Q-system baseband signal, and an offset setter that sets gains obtained by giving a predetermined offset to the selected gains in the first variable amplifier or the second variable amplifier in a predetermined number of times of gain control, and sets the selected gains in the first variable amplifier or the second variable amplifier in a subsequent gain control following after the predetermined number of times of the gain control.

Advantageous Effects of the Invention

According to the invention, time necessary to perform automatic gain control can be decreased in coarse adjustment of automatic gain control processing.

BRIEF DESCRIPTION OF THE DRAWINGS

FIG. 7(a) is a waveform diagram using less than a half cycle of a BPSK-modulated I signal as the measurement period, and FIG. 7(b) is a waveform diagram using a half cycle or more of the BPSK-modulated I signal as the measurement period.

MODE FOR CARRYING OUT THE INVENTION

An embodiment of an automatic gain control device according to the invention will hereinafter be described.

The automatic gain control device according to the invention is included in, for example, a receiver, and gain for amplifying signal power of a received signal inputted through an antenna for receiving is described as a "VGA (variable gain amplifier) gain control value". However, the automatic gain control device according to the invention is included in a transmitter in addition to the receiver. In addition, the receiver receives, for example, a BPSK-modulated signal.

Before the embodiment of the automatic gain control device according to the invention is described, an automatic gain control device used as the premise of the embodiment will hereinafter be described with reference to FIGS. 1 and 2.

Figure 1:
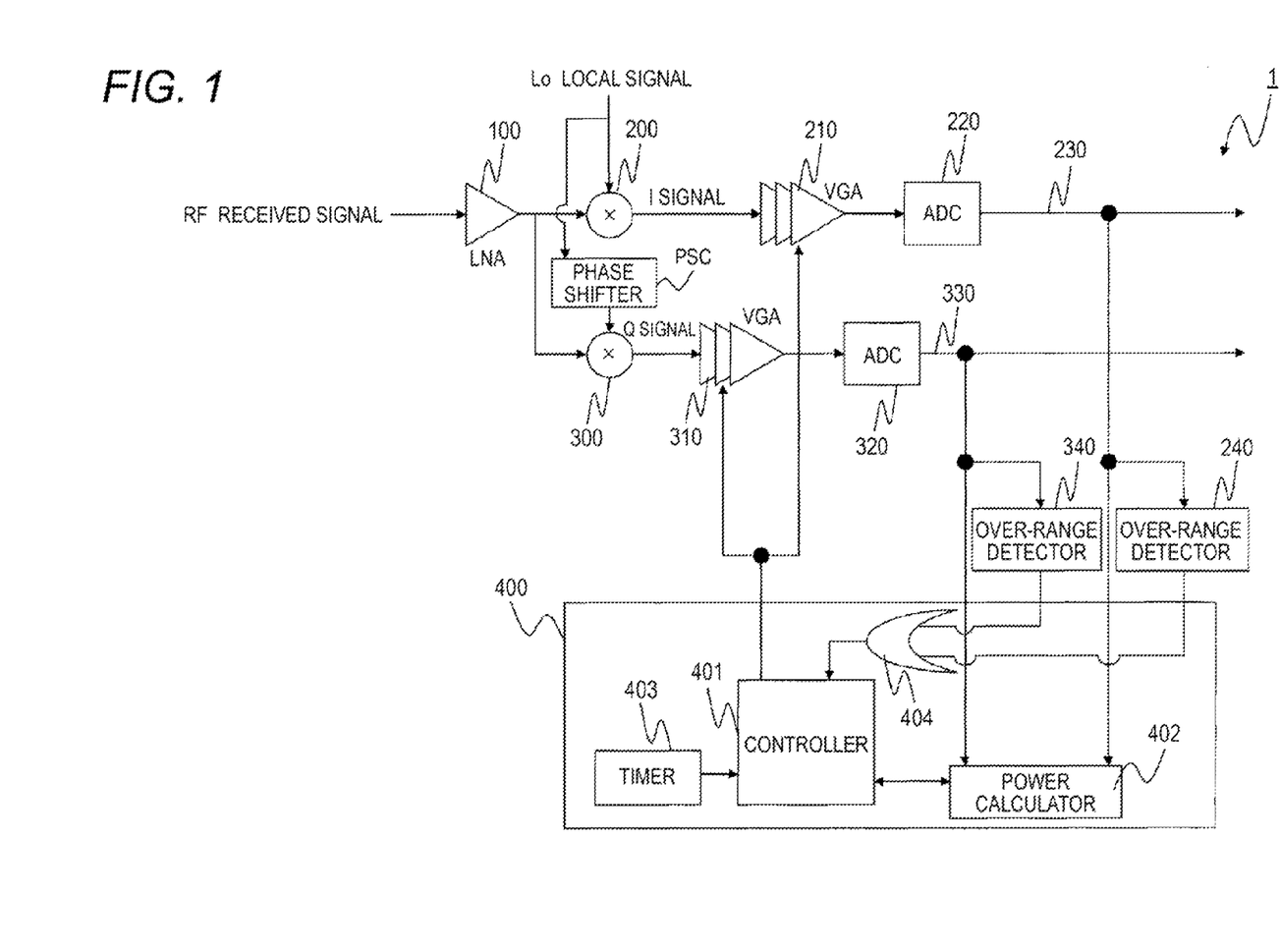
FIG. 1 is a block diagram showing an internal configuration of an automatic gain control device used as the premise of a first embodiment.

FIG. 1 is a block diagram showing an internal configuration of an automatic gain control device 1 used as the premise of a first embodiment. FIG. 2 is an explanatory diagram showing one example of control of the VGA gain control values of the automatic gain control device 1 used as the premise of the first embodiment.

Next, the configuration of the automatic gain control device 1 will be described.

The automatic gain control device 1 includes an LNA (low noise amplifier) 100, mixer circuits 200 and 300, a phase shifter PSC, a VGA 210 for I system, a VGA 310 for Q system, ADCs (analog digital converter) 220 and 320, over-range detectors 240 and 340, and an automatic gain controller 400 as shown in FIG. 1.

The automatic gain controller 400 has a controller 401, a power calculator 402, a timer 403, and an OR circuit 404.

Next, operation of the automatic gain control device 1 shown in FIG. 1 will be described.

A high-frequency received signal RF inputted through an antenna for receiving (not shown) is inputted to the LNA 100 and is amplified. The amplified received signal RF is respectively inputted to the mixer circuit 200 for I system and the mixer circuit 300 for Q system.

A local signal Lo with a predetermined frequency band is inputted from an oscillator (not shown) of a receiver including the automatic gain control device 1 to the mixer circuit 200 for I system. The predetermined frequency band is, for example, about 600 MHz in millimeter-wave communication.

The mixer circuit 200 for I system down-converts (frequency conversion) an I signal component of the received signal RF into a baseband signal using the local signal Lo and an in-phase component (I component) in the inputted received signal RF.

A signal 90° out of phase with the local signal Lo is inputted from the oscillator (not shown) of the receiver including the automatic gain control device 1 to the mixer circuit 300 for Q system through the phase shifter PSC.

The mixer circuit 300 for Q system down-converts (frequency conversion) a Q signal component of the received signal RF into a baseband signal using the signal 90° out of phase with the local signal Lo and an orthogonal component (Q component) in the inputted received signal RF.

Hereinafter, the baseband signal down-converted by the mixer circuit 200 for I system is described as an "I-system baseband signal". Also, the baseband signal down-converted by the mixer circuit 300 for Q system is described as a "Q-system baseband signal".

The down-converted I-system baseband signal is inputted to the VGA 210 for I system. The down-converted Q-system baseband signal is inputted to the VGA 310 for Q system.

The VGA 210 for I system as a first variable amplifier amplifies the I-system baseband signal by multiplying the inputted I-system baseband signal by a VGA gain control value set by the automatic gain controller 400. The VGA gain control value used in the VGA 210 for I system is set by a VGA gain control signal outputted from the automatic gain controller 400 according to the VGA gain control value.

The VGA 310 for Q system as a second variable amplifier amplifies the Q-system baseband signal by multiplying the inputted Q-system baseband signal by a VGA gain control value set by the automatic gain controller 400. The VGA gain control value used in the VGA 310 for Q system is set by a VGA gain control signal outputted from the automatic gain controller 400 according to the VGA gain control value.

The I-system baseband signal amplified by the VGA 210 for I system is inputted to the ADC 220. The Q-system baseband signal amplified by the VGA 310 for Q system is inputted to the ADC 320.

The ADC 220 converts the inputted analog I-system baseband signal into a digital signal. The converted I-system baseband signal 230 is outputted to a post-stage block of the automatic gain control device 1, and is further inputted to the over-range detector 240 and the automatic gain controller 400. In addition, the coarsely adjusted I-system baseband signal 230 is further used in fine adjustment.

The ADC 320 converts the inputted analog Q-system baseband signal into a digital signal. The converted Q-system baseband signal 330 is outputted to a post-stage block of the automatic gain control device 1, and is further inputted to the over-range detector 340 and the automatic gain controller 400. In addition, the coarsely adjusted Q-system baseband signal 330 is further used in fine adjustment.

In addition, the coarse adjustment means that adjustment is made to the VGA gain control value in which the inputted I and Q signals are at a level of no over-range and a predetermined minute reference level or more in the ADCs 220, 320.

Also, when the coarse adjustment is completed, the I signal and the Q signal become detectable properly. The fine adjustment is a phase controlled so that the average power of the I and Q signals inputted to the ADCs 220, 320 indicates a state of converging on the same constant level as the predefined reference level further from a state of the completion of the coarse adjustment.

In the coarse adjustment, the VGA gain control value is controlled so that a difference between the predefined reference level and the average power of the inputted I and Q signals is computed and its difference becomes zero.

The I-system baseband signal 230 converted by the ADC 220 is inputted to the over-range detector 240. The over-range detector 240 determines whether or not the inputted I-system baseband signal 230 is in an over-range state.

Concretely, the over-range detector 240 detects that the I-system baseband signal 230 is in the over-range state when the I-system baseband signal 230 which is an output signal from the ADC 220 is a predetermined upper limit value or more or a predetermined lower limit value or less. The predetermined upper or lower limit value is a threshold value for determining whether or not the output signal from the ADC is in the over-range state as shown by, for example, dotted lines of FIG. 6, and the same applies to the following explanation.

When the output signal from the ADC 220 is in the over-range state, the over-range detector 240 outputs detection information indicating that the over-range state is detected to the automatic gain controller 400.

The Q-system baseband signal 330 converted by the ADC 320 is inputted to the over-range detector 340. The over-range detector 340 determines whether or not the inputted Q-system baseband signal 330 is in an over-range state.

Concretely, the over-range detector 340 detects that the Q-system baseband signal 330 is in the over-range state when the Q-system baseband signal 330 which is an output signal from the ADC 320 is a predetermined upper limit value or more or a predetermined lower limit value or less.

When the output signal from the ADC 320 is in the over-range state, the over-range detector 340 outputs detection information indicating that the over-range state is detected to the automatic gain controller 400.

The I-system and Q-system baseband signals 230, 330 converted by the ADCs 220, 320 are inputted to the power calculator 402. The power calculator 402 calculates the average power based on the I-system and Q-system baseband signals 230, 330 inputted for a certain period measured in the timer 403 under control of the controller 401.

The average power can be calculated by, for example, the sum of mean squares of the I-system and Q-system baseband signals 230, 330. The certain period indicates time corresponding to one to several sampling times in the ADCs 220, 320. The power calculator 402 outputs the calculated average power to the controller 401.

When the I-system baseband signal 230 or the Q-system baseband signal 330 inputted is in the over-range state, the detection information outputted by the over-range detector 240 or 340 is inputted to the OR circuit 404. When the I-system baseband signal 230 or the Q-system baseband signal 330 is in the over-range state, the automatic gain controller 400 can recognize that the output signal from the ADC 220 or the ADC 320 is in the over-range state.

When the I-system baseband signal 230 and the Q-system baseband signal 330 are not in the over-range state, the controller 401 calculates a difference between average power and predefined target signal power based on the average power outputted by the power calculator 402. The controller 401 selects a VGA gain control value to be next set based on the difference between the average powers calculated. In addition, plural VGA gain control values are predefined in the controller 401 (see FIG. 2).

The controller 401 outputs a VGA gain control signal to the VGA 210 for I system and the VGA 310 for Q system in order to set the same selected VGA gain control value in the VGA 210 for I system and the VGA 310 for Q system. The controller 401 adjusts the VGA gain control value so that the difference between the target signal power and the average power calculated by the power calculator 402 becomes zero by repeating this control plural times.

When the I-system baseband signal 230 or the Q-system baseband signal 330 is in the over-range state, the controller 401 selects other VGA gain control value of the plural VGA gain control values regardless of a calculated result of the power calculator 402. In addition, in the selected VGA gain control value, the VGA gain control value smaller than the present VGA gain control value is selected so that signal powers of the I-system baseband signal and the Q-system baseband signal inputted to the ADCs 220 and 320 become smaller.

Next, a method for selecting the VGA gain control value of the automatic gain controller 400 will be described. Two kinds of method for selecting the VGA gain control value will be described.

In millimeter-wave communication, the number of effective bits for respectively making AD conversion of I and Q signals of received signals is smaller than the number of effective bits of an ADC in the case of communicating using a conventional wireless LAN in order to operate at higher speed than that of the ADC used in the conventional wireless LAN. As a result, the range of a level of the received signal detectable in the automatic gain control device is narrow and is 10 dB to 20 dB.

Hereinafter, the range of signal power of the I-system baseband signal and the Q-system baseband signal inputted to the VGA 210 for I system and the VGA 310 for Q system shall be, for example, −20 dBm to −80 dBm.

Further, the effective range of signal power detectable in the ADCs 220 and 320 shall be 10 dBm. This effective range depends on the number of effective bits corresponding to resolutions of the ADCs 220, 320.

Figure 2:
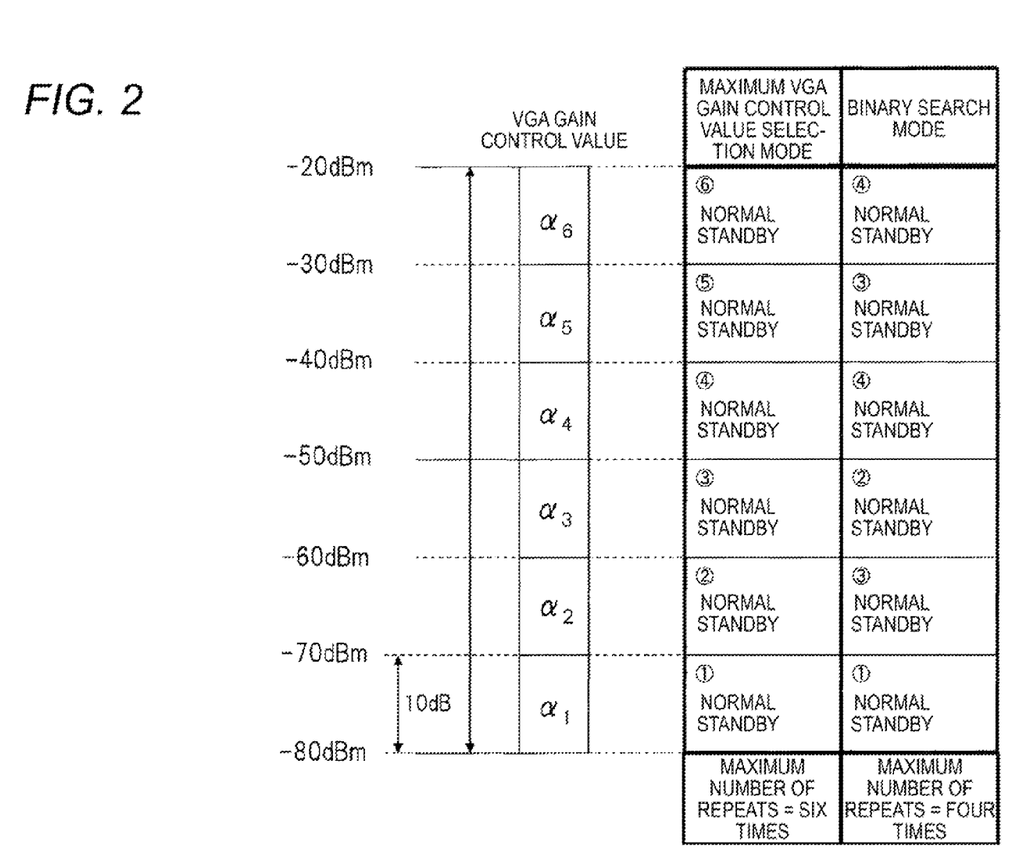
FIG. 2 is an explanatory diagram showing one example of control of VGA gain control values of the automatic gain control device used as the premise of the first embodiment.

As shown in FIG. 2, parameters $\alpha_1$ to $\alpha_6$ are the VGA gain control values, and the parameter $\alpha_1$ has the maximum value and the values become small sequentially and the parameter $\alpha_6$ has the minimum value.

When a signal having signal power of −70 dBm to −80 dBm is detected in the ADCs 220, 320, the automatic gain controller 400 selects the parameter $\alpha_1$ as the VGA gain control value for amplifying the I-system baseband signal and the Q-system baseband signal. In addition, the parameter $\alpha_1$ is the VGA gain control value (gain) for amplifying the signal having signal power of −70 dBm to −80 dBm to the extent that the signal is not saturated in the ADCs 220, 320.

When a signal having signal power of −60 dBm to −70 dBm is detected in the ADCs 220, 320, the automatic gain controller 400 selects the parameter $\alpha_2$ as the VGA gain control value for amplifying the I-system baseband signal and the Q-system baseband signal. In addition, the parameter $\alpha_2$ is the VGA gain control value (gain) for amplifying the signal having signal power of −60 dBm to −70 dBm to the extent that the signal is not saturated in the ADCs 220, 320.

When a signal having signal power of −50 dBm to −60 dBm is detected in the ADCs 220, 320, the automatic gain controller 400 selects the parameter $\alpha_3$ as the VGA gain control value for amplifying the I-system baseband signal and the Q-system baseband signal. In addition, the parameter $\alpha_3$ is the VGA gain control value (gain) for amplifying the signal having signal power of −50 dBm to −60 dBm to the extent that the signal is not saturated in the ADCs 220, 320.

When a signal having signal power of −40 dBm to −50 dBm is detected in the ADCs 220, 320, the automatic gain controller 400 selects the parameter $\alpha_4$ as the VGA gain control value for amplifying the I-system baseband signal and the Q-system baseband signal. In addition, the parameter $\alpha_4$ is the VGA gain control value (gain) for amplifying the signal having signal power of −40 dBm to −50 dBm to the extent that the signal is not saturated in the ADCs 220, 320.

When a signal having signal power of −30 dBm to −40 dBm is detected in the ADCs 220, 320, the automatic gain controller 400 selects the parameter $\alpha_5$ as the VGA gain control value for amplifying the I-system baseband signal and the Q-system baseband signal. In addition, the parameter $\alpha_5$ is the VGA gain control value (gain) for amplifying the signal having signal power of −30 dBm to −40 dBm to the extent that the signal is not saturated in the ADCs 220, 320.

When a signal having signal power of −20 dBm to −30 dBm is detected in the ADCs 220, 320, the automatic gain controller 400 selects the parameter $\alpha_6$ as the VGA gain control value for amplifying the I-system baseband signal and the Q-system baseband signal. In addition, the parameter $\alpha_6$ is the VGA gain control value (gain) for amplifying the signal having signal power of −20 dBm to −30 dBm to the extent that the signal is not saturated in the ADCs 220, 320.

First, the first method for selecting the VGA gain control value, that is, a maximum VGA gain control value selection mode will be described.

The controller 401 selects the maximum value $\alpha_1$ of the VGA gain control value as the first VGA gain control value. The controller 401 respectively outputs a VGA gain control signal according to the selected value $\alpha_1$ to the VGA 210 for I system and the VGA 310 for Q system in order to set the selected VGA gain control value $\alpha_1$.

The controller 401 selects the VGA gain control value based on the average power outputted by the power calculator 402 unless detection information about an over-range is outputted by the over-range detectors 240 and 340.

When the detection information about the over-range is outputted by the over-range detector 240 or 340, the controller 401 selects the largest VGA gain control value $\alpha_2$ next to the VGA gain control value $\alpha_1$ selected at present. The controller 401 respectively outputs a VGA gain control signal according to the selected value $\alpha_2$ to the VGA 210 for I system and the VGA 310 for Q system in order to set the selected VGA gain control value $\alpha_2$.

When the detection information about the over-range is outputted by the over-range detector 240 or 340 even after the VGA gain control value $\alpha_2$ is set in the VGA 210 for I system and the VGA 310 for Q system, the controller 401 selects the third largest VGA gain control value $\alpha_3$. The controller 401 respectively outputs a VGA gain control signal according to the selected value $\alpha_3$ to the VGA 210 for I system and the VGA 310 for Q system in order to set the selected VGA gain control value $\alpha_3$.

The controller 401 repeats selection of the VGA gain control value similarly when the detection information about the over-range is again outputted after the VGA gain control value is set.

In automatic gain control using the method described above, the number of selections of the VGA gain control value becomes the maximum (six times) in coarse adjustment of the automatic gain control when an output signal of the ADC 220, 320 has the signal power of −20 dBm to −30 dBm. A decrease in the number of selections of the VGA gain control value is required in order to decrease the time necessary to make the coarse adjustment of the automatic gain control.

In addition, signal power of the output signal of the ADC 220 or 320 may be small even when the detection information about the over-range is not outputted by the over-range detector 240 or 340. The controller 401 selects the VGA gain control value larger than the currently selected VGA gain control value based on the average power outputted by the power calculator 402. The controller 401 respectively outputs a VGA gain control signal according to the selected value to the VGA 210 for I system and the VGA 310 for Q system in order to set the selected VGA gain control value.

Next, the second method for selecting the VGA gain control value, that is, a binary search mode will be described. This selection method uses a concept of binary search.

The controller 401 selects the maximum value $\alpha_1$ of the VGA gain control value as the first VGA gain control value, and respectively outputs a VGA gain control signal according to the selected value $\alpha_1$ to the VGA 210 for I system and the VGA 310 for Q system in order to set the selected VGA gain control value $\alpha_1$.

The controller 401 selects the VGA gain control value based on the average power outputted by the power calculator 402 unless detection information about an over-range is outputted by the over-range detectors 240 and 340.

When the detection information about the over-range is outputted by the over-range detector 240 or 340, the controller 401 selects the VGA gain control value $\alpha_3$ of all the VGA gain control values $\alpha_1$ to $\alpha_6$ as a median value. In addition, in FIG. 2, $\alpha_4$ may be selected as the median value. The controller 401 respectively outputs a VGA gain control signal according to the selected value $\alpha_3$ to the VGA 210 for I system and the VGA 310 for Q system in order to set the selected VGA gain control value $\alpha_3$.

It is assumed that the detection information about the over-range is outputted by the over-range detector 240 or 340 even after the VGA gain control value $\alpha_3$ is set in the VGA 210 for I system and the VGA 310 for Q system. The controller 401 selects the VGA gain control value $\alpha_5$ of all the other VGA gain control values $\alpha_4$ to $\alpha_6$ as the median value.

The controller 401 selects the VGA gain control value based on the average power outputted by the power calculator 402 unless the detection information about the over-range is outputted by the over-range detectors 240 and 340.

In addition, when the average power outputted by the power calculator 402 is minute, the controller 401 selects the small VGA gain control value $\alpha_5$ with respect to signal power of output signals of the ADCs 220 and 320. As a result, the controller 401 selects the larger VGA gain control value $\alpha_4$ in order to increase the signal power of the output signals of the ADCs 220 and 320.

Also, when the detection information about the over-range is outputted by the over-range detector 240 or 340, or when the average power calculated by the power calculator 402 exceeds a measurable range (see dotted lines of FIG. 6) of the ADCs 220 and 320, the controller 401 selects the largest VGA gain control value $\alpha_6$ next to the VGA gain control value $\alpha_5$ selected at present.

By selecting the VGA gain control value using an algorithm of the binary search in this manner, the number of selections of the VGA gain control value becomes four times in coarse adjustment of automatic gain control.

Next, the embodiment of the automatic gain control device according to the invention will be described with reference to FIGS. 3 to 6.

Figure 3:
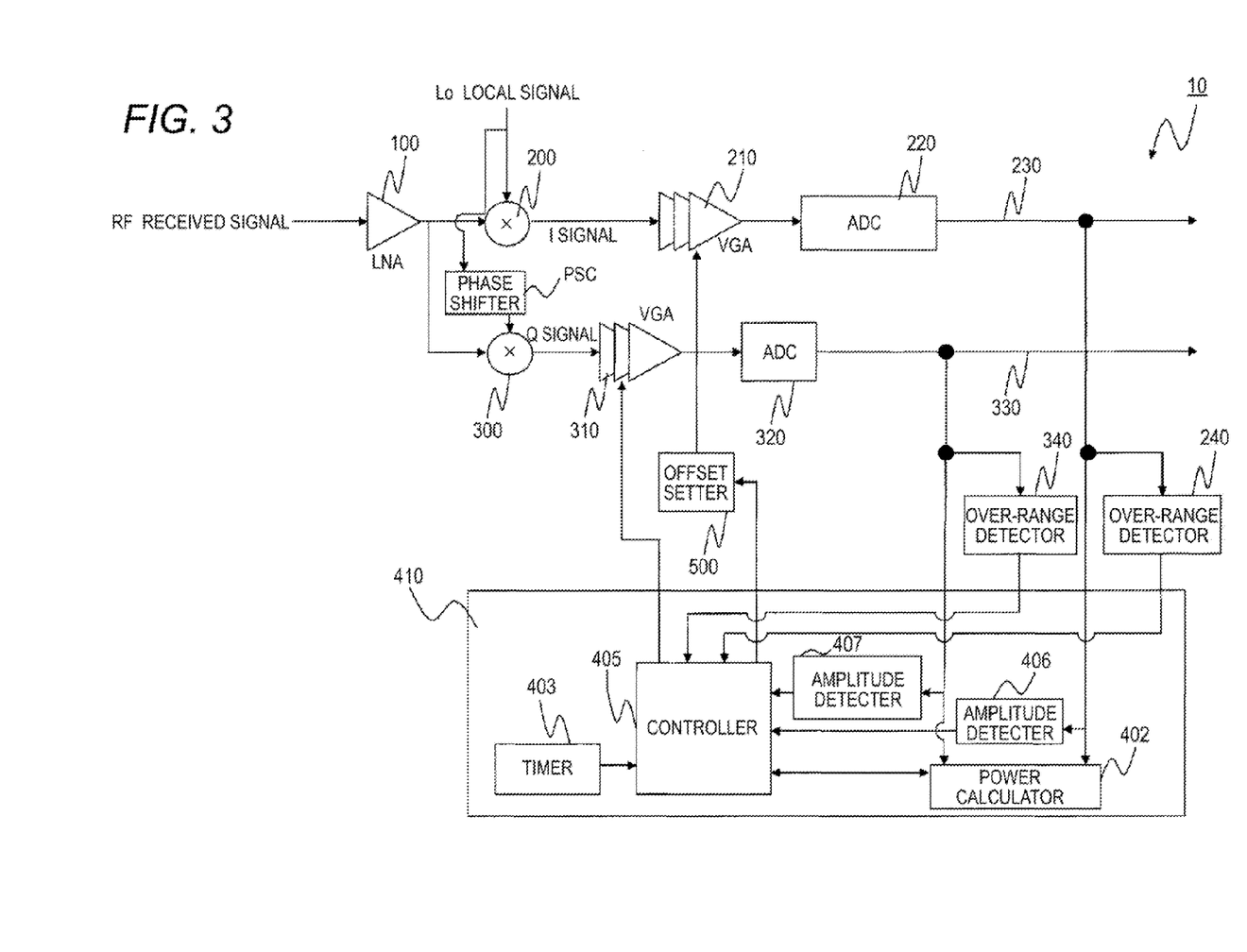
FIG. 3 is a block diagram showing an internal configuration of an automatic gain control device of the first embodiment.
Figure 4:
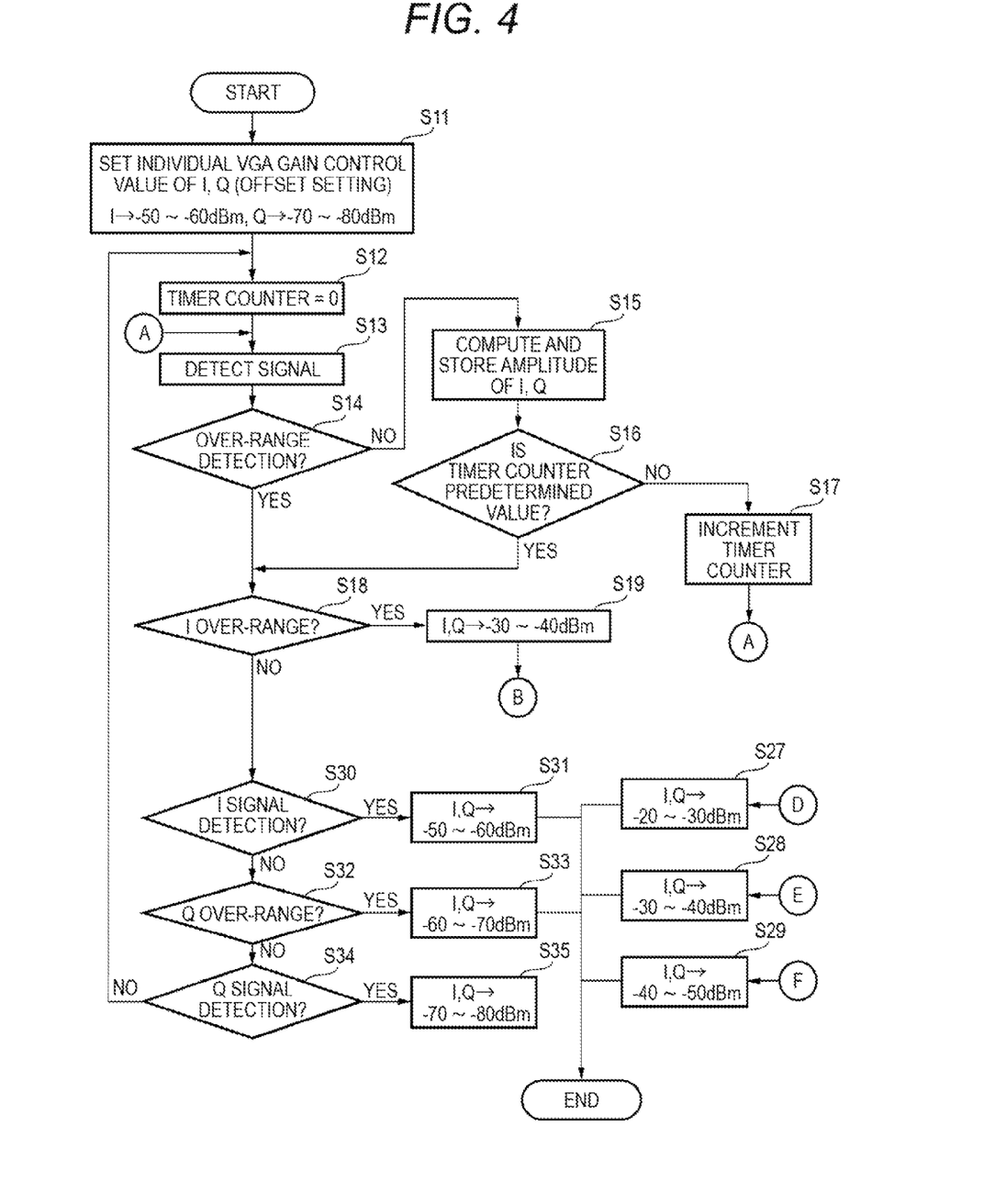
FIG. 4 is a flowchart describing operation of the automatic gain control device of the first embodiment.
Figure 5:
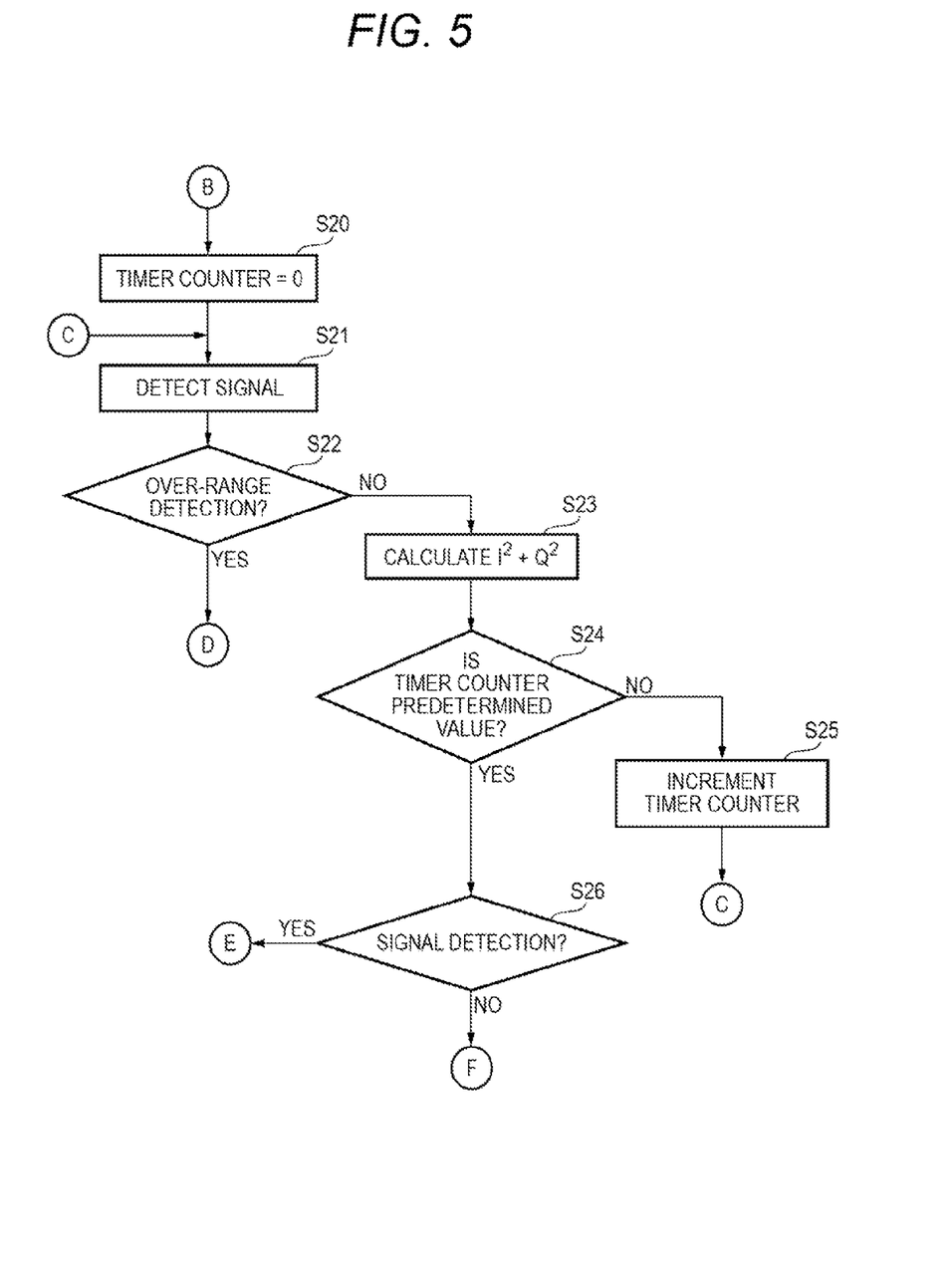
FIG. 5 is a flowchart describing operation of the automatic gain control device of the first embodiment.

FIG. 3 is a block diagram showing an internal configuration of an automatic gain control device 10 of the first embodiment. FIGS. 4 and 5 are flowcharts describing operation of the automatic gain control device 10 of the first embodiment.

Figure 6:
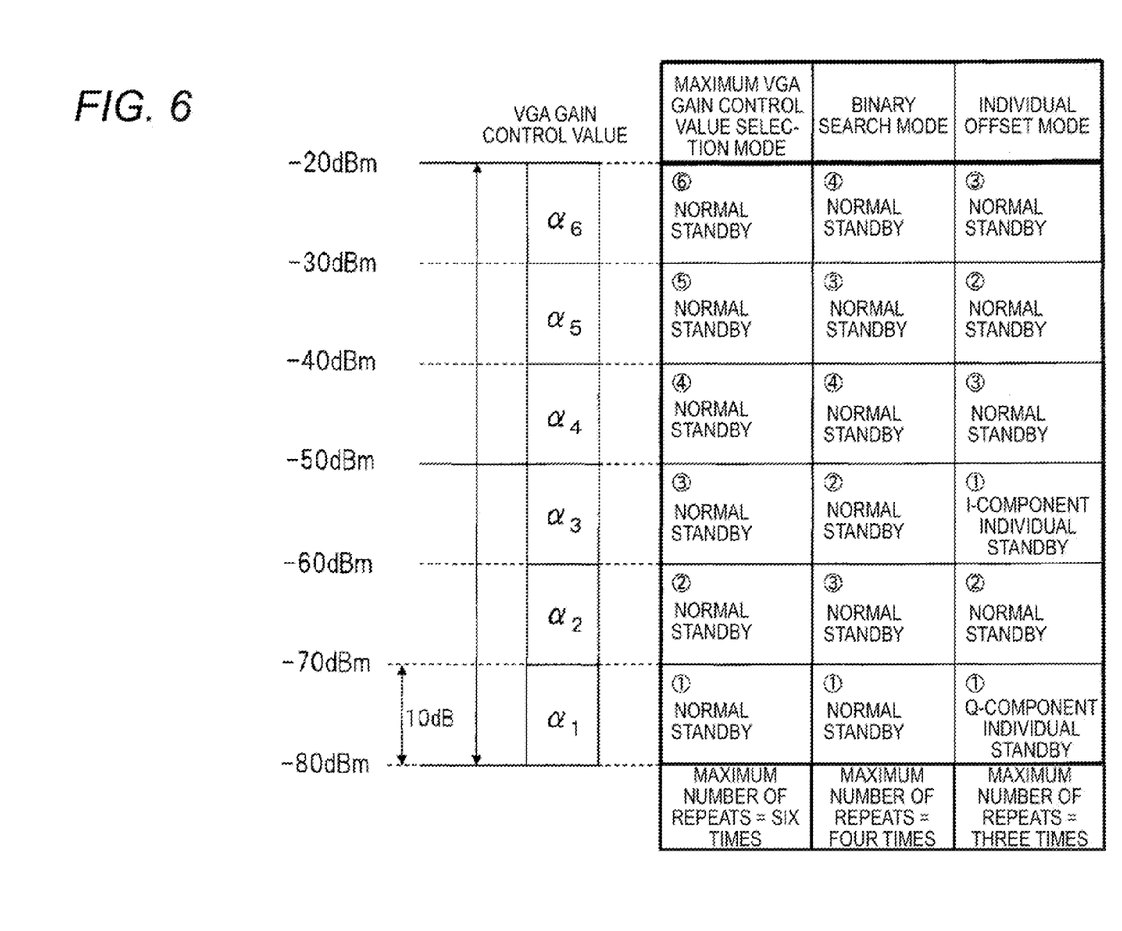
FIG. 6 is an explanatory diagram showing one example of control of VGA gain control values of the automatic gain control device of the first embodiment.

FIG. 6 is an explanatory diagram showing one example of control of VGA gain control values of the automatic gain control device 10 of the first embodiment. In addition, an individual offset mode shown in FIG. 6 is a mode of decreasing the number of controls by giving different VGA gain control values to a VGA 210 for I system and a VGA 310 for Q system in the first gain control.

Next, the configuration of the automatic gain control device 10 will be described.

In addition, in the automatic gain control device 10 shown in FIG. 3, the same numerals are assigned to components of the same configuration and operation as each of the components of the automatic gain control device 1 shown in FIG. 1. Hereinafter, explanation of the same configuration and operation as each of the components of the automatic gain control device 1 is omitted, and different configuration and operation are described.

The automatic gain control device 10 includes an LNA 100, mixer circuits 200 and 300, a phase shifter PSC, a VGA 210 for I system, a VGA 310 for Q system, ADCs 220 and 320, over-range detectors 240 and 340, an automatic gain controller 410, and an offset setter 500 as shown in FIG. 3.

The automatic gain controller 410 has a controller 405, a power calculator 402, a timer 403, and amplitude detectors 406 and 407.

Next, operation of the automatic gain control device 10 shown in FIG. 3 will be described with reference to FIGS. 4 to 6. In addition, the operation ranging to a step of inputting I and Q signals to the VGA 210 for I system and the VGA 310 for Q system is similar to the operation of the automatic gain control device 1 shown in FIG. 1 described above.

The controller 405 selects the same VGA gain control value in order to set the same VGA gain control value in the VGA 210 for I system and the VGA 310 for Q system.

The controller 405 outputs a VGA gain control signal according to the selected value to the offset setter 500 in order to set the same selected VGA gain control value in the VGA 210 for I system.

The offset setter 500 gives an offset of a predetermined VGA gain control value to the VGA gain control value selected by the controller 405 according to the VGA gain control signal outputted by the controller 405. That is, the offset setter 500 selects a VGA gain control value (an offset VGA gain control value) different from the VGA gain control value selected by the controller 405.

For example, when the VGA gain control signal indicates a VGA gain control value $\alpha_1$, the offset setter 500 selects a VGA gain control value $\alpha_3$ as the offset VGA gain control value.

The offset setter 500 outputs a VGA gain control signal according to the offset VGA gain control value to the VGA 210 for I system in order to set the offset VGA gain control value in the VGA 210 for I system (S11).

Also, the offset setter 500 sets the same VGA gain control value as the VGA gain control value according to the VGA gain control signal outputted by the controller 405 in the VGA 210 for I system in the second and subsequent setting (gain control) of the VGA gain control value.

That is, the offset setter 500 does not give an offset of the VGA gain control value selected by the controller 405 in the second and subsequent gain control after the VGA gain control value offset in the first gain control is set in the VGA 210 for I system.

The controller 405 outputs a VGA gain control signal according to the selected value to the VGA 310 for Q system in order to set the same VGA gain control value as the VGA gain control value selected for setting in the VGA 210 for I system in the VGA 310 for Q system.

The controller 405 sets the selected VGA gain control value in the VGA 310 for Q system according to the VGA gain control signal (S11).

In step S11, for example, it is assumed that as the first gain, the VGA gain control value $\alpha_3$ is set in the VGA 210 for I system and the VGA gain control value $\alpha_1$ is set in the VGA 310 for Q system (S11, see FIG. 5).

In addition, as shown in FIG. 3, the offset setter 500 is constructed so as to make connection between the automatic gain controller 410 and the VGA 210 for I system, but may be constructed so as to make connection between the automatic gain controller 410 and the VGA 310 for Q system.

After step S11, the automatic gain controller 410 detects output signals of the ADCs 220 and 320 until a certain period has elapsed since a counter of the timer 403 was reset (S12) (S13). In addition, the certain period indicates the time corresponding to a half cycle or more of a BPSK-modulated received signal as shown in FIG. 7(b).

Figure 7:
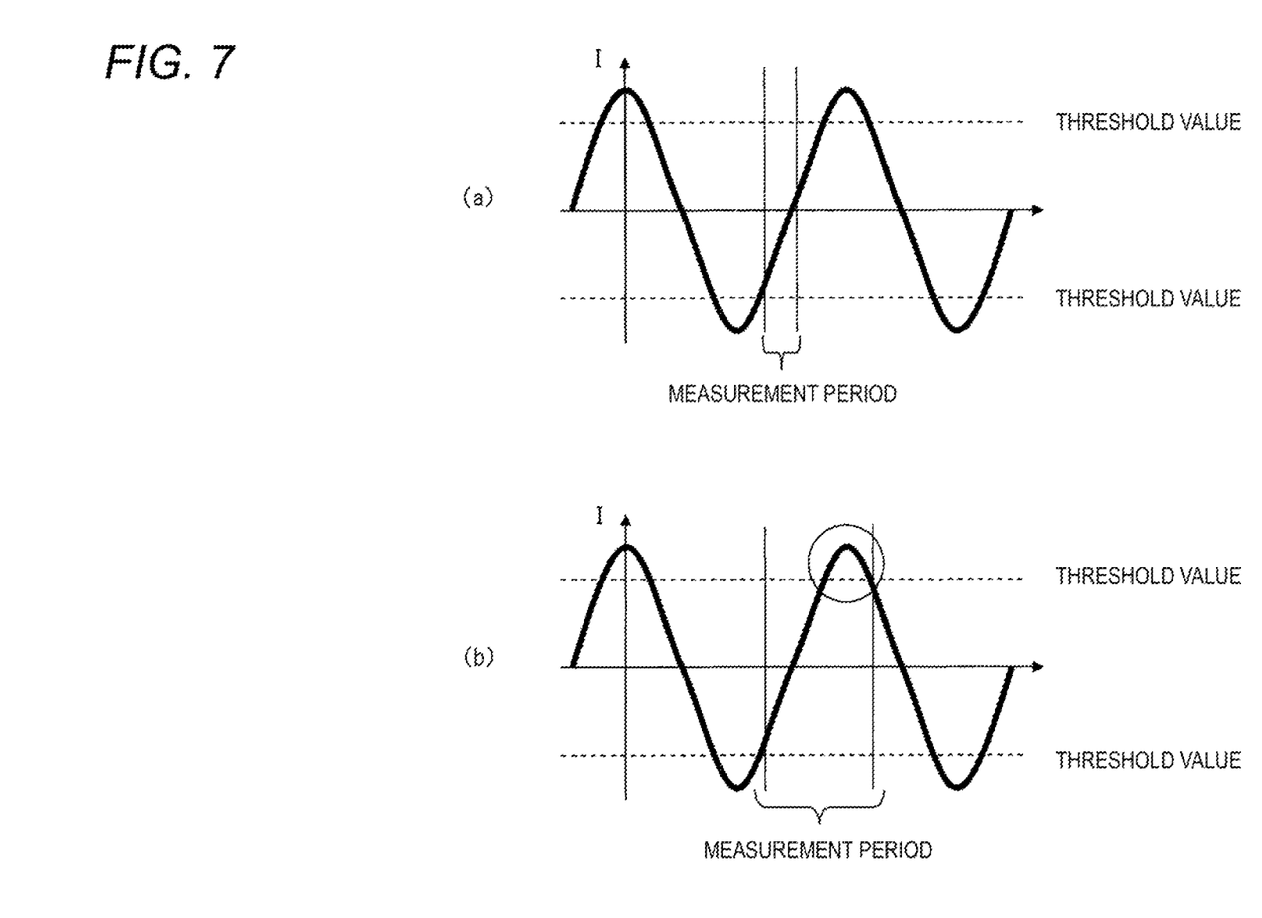
FIG. 7 is an explanatory diagram describing a measurement period of an I signal or a Q signal.

FIG. 7 is an explanatory diagram describing a measurement period of an I signal or a Q signal. FIG. 7(a) is a waveform diagram using less than a half cycle of a BPSK-modulated I signal (I-system baseband signal) as the measurement period. FIG. 7(b) is a waveform diagram using a half cycle or more of the BPSK-modulated I signal as the measurement period.

Dotted lines in FIGS. 7(a) and 7(b) indicate, for example, threshold values in the case where the over-range detector 240 determines whether or not an output signal of the ADC 220 is in an over-range state.

As shown in FIG. 7(a), it is assumed that the automatic gain controller 410 detects the output signal of the ADC 220 only for the measurement time corresponding to less than a half cycle of the BPSK-modulated I signal in step S13. The automatic gain controller 410 may be unaware of an over-range even when the output signal of the ADC 220 or 320 is in the over-range state for the measurement period shown in FIG. 7(a).

On the other hand, as shown in FIG. 7(b), it is assumed that the automatic gain controller 410 detects the output signal of the ADC 220 for the measurement time corresponding to a half cycle or more of the BPSK-modulated I signal in step S13. The automatic gain controller 410 can surely detect that the output signal of the ADC 220 is in the over-range state regardless of the measurement period.

In addition, FIGS. 7(a) and 7(b) show a waveform of the BPSK-modulated I signal, but a half cycle or more is similarly required as a measurement period for determining whether or not a waveform (an output signal of the ADC 320) of a BPSK-modulated Q signal is in an over-range state.

When, for example, the I-system baseband signal of the output signals of the ADCs 220 and 320 is in an over-range state (S18, YES), the controller 405 selects the same VGA gain control value $\alpha_5$ for setting in the VGA 210 for I system and the VGA 310 for Q system as the second gain control (see FIG. 5).

In addition, when the I-system baseband signal is in the over-range state in step S14, it is considered that a Q-system baseband signal is also in an over-range state. As a result, the controller 405 selects the common VGA gain control value $\alpha_5$ smaller than each of the VGA gain control values individually set for the first gain control in the VGA 210 for I system and the VGA 310 for Q system for the second gain control.

In addition, in the second and subsequent gain control, the offset setter 500 does not set an offset with respect to a VGA gain control signal.

The controller 405 respectively sets the selected common VGA gain control value $\alpha_5$ in the VGA 210 for I system and the VGA 310 for Q system according to the VGA gain control signal (S19).

When the output signals of the ADCs 220 and 320 are not in the over-range state (S14, NO), the amplitude detectors 406 and 407 compute amplitude information about the output signals of the ADCs 220 and 320 (S15). The amplitude detectors 406 and 407 output the amplitude information to the controller 405. In addition, the amplitude information is used in fine adjustment after coarse adjustment in the automatic gain control device 10, and is temporarily stored in the controller 405.

When a certain period has elapsed since the counter of the timer 403 was reset after step S15 (S16, YES), the flowchart proceeds to processing of step S18. When the certain period has not elapsed since the counter of the timer 403 was reset after step S15 (S16, NO), the timer 403 increments the counter (S17). Thereafter, until the certain period has elapsed, processing of step S13 to step S16 is repeated.

Also, after step S19, the automatic gain controller 410 detects output signals of the ADCs 220 and 320 until a certain period has elapsed since the counter of the timer 403 was reset (S20) (S21). In addition, the certain period in step S21 indicates the time corresponding to one to several sampling times in the ADCs 220 and 320.

When the I-system baseband signal or the Q-system baseband signal of the output signals of the ADCs 220 and 320 is in an over-range state (S22, YES), the controller 405 selects the VGA gain control value $\alpha_6$ for setting in the VGA 210 for I system and the VGA 310 for Q system as the third gain control (S27, see FIG. 5).

The controller 405 outputs a VGA gain control signal according to the selected value $\alpha_6$ to the VGA 210 for I system and the VGA 310 for Q system in order to set the selected VGA gain control value $\alpha_6$ in the VGA 210 for I system and the VGA 310 for Q system. The operation (processing of coarse adjustment) of the automatic gain control device 10 is ended.

When the output signals of the ADCs 220 and 320 are not in the over-range state (S22, NO), the power calculator 402 acquires signal power of the output signals of the ADCs 220 and 320. The power calculator 402 calculates instantaneous power every regular interval or average power of the I-system baseband signals and the Q-system baseband signals from the signal power, and outputs the power to the controller 405 (S23). In addition, average power information is used in fine adjustment after coarse adjustment in the automatic gain control device 10, and is temporarily stored in the controller 405.

When a certain period has elapsed since the counter of the timer 403 was reset after step S23 (S24, YES), the flowchart proceeds to processing of step S26. When the certain period has not elapsed since the counter of the timer 403 was reset after step S23 (S24, NO), the timer 403 increments the counter (S25). Thereafter, until the certain period has elapsed, processing of step S21 to step S24 is repeated.

In step S26, the controller 405 determines whether or not the average power of the power calculator 402 exceeds a threshold value predefined for signal detection, or whether or not the instantaneous power exceeds a threshold value predefined for signal detection for a certain period or more (S26).

In addition, in step S23, the average power or the instantaneous power calculated by the power calculator 402 is used, but at least one of the amplitude detectors 406 and 407 calculates amplitude information and in step S26, the amplitude detectors 406 and 407 can also decide signal detection. This is because the VGA 210 for I system and the VGA 310 for Q system are set in the same VGA gain control value $\alpha_4$ in step S19.

Concretely, when the output signals of the ADCs 220 and 320 exceed the threshold value (S26, YES), the controller 405 maintains the VGA gain control value set in step S19 (S28). The operation (processing of coarse adjustment) of the automatic gain control device 10 is ended.

Also, when the output signal of the ADC 220 or 320 does not exceed the threshold value (S26, NO), the controller 405 selects the VGA gain control value $\alpha_4$ for setting in the VGA 210 for I system and the VGA 310 for Q system as the third gain control (S29).

The controller 405 outputs a VGA gain control signal according to the selected value $\alpha_4$ to the VGA 210 for I system and the VGA 310 for Q system in order to set the selected VGA gain control value $\alpha_4$ in the VGA 210 for I system and the VGA 310 for Q system. The operation (processing of coarse adjustment) of the automatic gain control device 10 is ended.

On the other hand, when the output signal of the ADC 220 is not in the over-range state in step S18 (S18, NO), the amplitude detector 406 determines whether or not the output signal of the ADC 220 exceeds a threshold value predefined for signal detection (S30).

Concretely, when the output signal of the ADC 220 exceeds the threshold value in step S30 (S30, YES), the controller 405 selects the VGA gain control value $\alpha_3$ for setting in the VGA 210 for I system and the VGA 310 for Q system as the second gain control (S31).

The controller 405 outputs a VGA gain control signal according to the selected value $\alpha_3$ to the VGA 210 for I system and the VGA 310 for Q system in order to set the selected VGA gain control value $\alpha_3$ in the VGA 210 for I system and the VGA 310 for Q system. The operation (processing of coarse adjustment) of the automatic gain control device 10 is ended.

Also, when the output signal of the ADC 220 does not exceed the threshold value in step S30 (S30, NO), the automatic gain controller 410 determines whether or not the output signal of the ADC 320 is in an over-range state (S32).

Concretely, when the output signal of the ADC 320 is in the over-range state in step S32 (S32, YES), the controller 405 selects the VGA gain control value $\alpha_2$ for setting in the VGA 210 for I system and the VGA 310 for Q system as the second gain control (S33).

The controller 405 outputs a VGA gain control signal according to the selected value $\alpha_2$ to the VGA 210 for I system and the VGA 310 for Q system in order to set the selected VGA gain control value $\alpha_2$ in the VGA 210 for I system and the VGA 310 for Q system. The operation (processing of coarse adjustment) of the automatic gain control device 10 is ended.

When the output signal of the ADC 320 is not in the over-range state in step S32 (S32, NO), the amplitude detector 407 determines whether or not the output signal of the ADC 320 exceeds a threshold value predefined for signal detection (S34).

Concretely, when the output signal of the ADC 320 exceeds the threshold value in step S34 (S34, YES), the controller 405 selects the VGA gain control value $\alpha_1$ for setting in the VGA 210 for I system and the VGA 310 for Q system as the second gain control (S30).

The controller 405 outputs a VGA gain control signal according to the selected value $\alpha_1$ to the VGA 210 for I system and the VGA 310 for Q system in order to set the selected VGA gain control value $\alpha_1$ in the VGA 210 for I system and the VGA 310 for Q system. The operation (processing of coarse adjustment) of the automatic gain control device 10 is ended.

Also, when the output signal of the ADC 320 does not exceed the threshold value in step S34 (S34, NO), the automatic gain controller 410 detects the output signals of the ADCs 220, 320 until a certain period has elapsed since the counter of the timer 403 was reset (S12). That is, when the output signal of the ADC 320 does not exceed the threshold value in step S34 (S34, NO), processing of step S12 and later is repeated.

According to the automatic gain control device 10 of the first embodiment as described above, the number of settings of the VGA gain control value in the VGA 210 for I system and the VGA 310 for Q system becomes a maximum of three times and thereby coarse adjustment can be made. That is, according to the automatic gain control device 10, the time necessary to perform automatic gain control can be decreased in the coarse adjustment of automatic gain control processing.

Further, the automatic gain control device 10 can coarsely adjust automatic gain control at high speed, and can shorten a preamble signal capable of being allocated to automatic gain control processing.

That is, in processing including at least one or more of other synchronous establishment or AFC (auto frequency control) in addition to automatic gain control, the preamble signal can be allocated longer and also in millimeter-wave communication, communication performance can be improved.

Various embodiments have been described above with reference to the drawings, but it goes without saying that the invention is not limited to such an example. It is apparent that persons skilled in the art may reach various change examples or modified examples within the scope of the claims, and it is understood that their change examples or modified examples naturally belong to the technical scope of the invention.

In addition, in the first embodiment, setting timing of each of the different VGA gain control values set in the VGA 210 for I system and the VGA 310 for Q system is the first point in time of the flowchart shown in FIG. 5. However, each of the VGA gain control values may be set at any point in time.

Merely, the automatic gain control device 10 according to the invention uses each of the different VGA gain control values for setting in the VGA 210 for I system and the VGA 310 for Q system in coarse adjustment of automatic gain control.

Consequently, in fine adjustment after coarse adjustment of automatic gain control, it is necessary to calculate the average power in a state in which the same VGA gain control value is set in the VGA 210 for I system and the VGA 310 for Q system, so that it is preferable to individually set the VGA gain control values at the first point in time of the flowchart shown in FIG. 4.

Also, the resolutions (10 dBm) of the ADCs 220, 320 and the range of signal power of the I-system baseband signal, the Q-system baseband signal described in the first embodiment are one example, and are not particularly limited.

In addition, explanation is offered using BPSK, but as long as a baseband signal including an I component or a Q component is used, QPSK, 8PSK or 16QAM can similarly be used.

In addition, the present application is based on Japanese patent application (patent application No. 2011-039019) filed on Feb. 24, 2011, and the contents of the patent application are hereby incorporated by reference.

Industrial Applicability

The invention can be applied to a wireless communication apparatus including an automatic gain control device capable of improving communication performance by decreasing time necessary to perform automatic gain control in coarse adjustment of automatic gain control processing in the case of receiving an orthogonally-modulated sent signal.

DESCRIPTION OF REFERENCE NUMERALS AND SIGNS

1,10 AUTOMATIC GAIN CONTROL DEVICE
100 LNA
200 MIXER CIRCUIT FOR I SYSTEM
210 VGA FOR I SYSTEM
230 I-SYSTEM BASEBAND SIGNAL
240,340 OVER-RANGE DETECTOR
300 MIXER CIRCUIT FOR Q SYSTEM
310 VGA FOR Q SYSTEM
330 Q-SYSTEM BASEBAND SIGNAL
400,410 AUTOMATIC GAIN CONTROLLER
401,405 CONTROLLER
402 POWER CALCULATOR
403 TIMER
404 OR CIRCUIT
406,407 AMPLITUDE DETECTOR
500 OFFSET SETTER
Lo LOCAL SIGNAL
PSC PHASE SHIFTER
RF RECEIVED SIGNAL

The invention claimed is:

1. An automatic gain control device comprising:
a first frequency converter that generates an I-system baseband signal based on a high-frequency received signal and a first local signal with a predetermined frequency band;
a second frequency converter that generates a Q-system baseband signal based on the high-frequency received signal and a second local signal 90° out of phase with the first local signal;
a first variable amplifier that amplifies the generated I-system baseband signal;
a second variable amplifier that amplifies the generated Q-system baseband signal;
a first AD converter that coverts the amplified I-system baseband signal into a digital signal;
a second AD converter that coverts the amplified Q-system baseband signal into a digital signal;
a first over-range detector that detects an over-range of the first AD converter;
a second over-range detector that detects an over-range of the second AD converter;
an automatic gain controller that selects gains set in the first variable amplifier and the second variable amplifier based on detection information about the over-range, the I-system baseband signal or the Q-system baseband signal; and
an offset setter that sets gains which are obtained by giving a predetermined offset to the selected gains in the first variable amplifier or the second variable amplifier in a gain control, and sets the selected gains in the first variable amplifier or the second variable amplifier in a subsequent gain control following after the gain control.

2. The automatic gain control device according to claim 1, wherein the automatic gain controller selects common gain to be set in the first variable amplifier and the second variable amplifier when the I-system baseband signal or the Q-system baseband signal is in an over-range state.

* * * * *